United States Patent
Tsuruda et al.

(10) Patent No.: US 9,436,598 B2
(45) Date of Patent: Sep. 6, 2016

(54) SEMICONDUCTOR DEVICE WITH NONVOLATILE MEMORY PREVENTED FROM MALFUNCTIONING CAUSED BY MOMENTARY POWER INTERRUPTION

(75) Inventors: Tamaki Tsuruda, Kawasaki (JP); Tamiyu Kato, Kawasaki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 457 days.

(21) Appl. No.: 14/003,100

(22) PCT Filed: Mar. 4, 2011

(86) PCT No.: PCT/JP2011/055059
§ 371 (c)(1),
(2), (4) Date: Sep. 4, 2013

(87) PCT Pub. No.: WO2012/120591
PCT Pub. Date: Sep. 13, 2012

(65) Prior Publication Data
US 2013/0339590 A1 Dec. 19, 2013

(51) Int. Cl.
G06F 12/00 (2006.01)
G06F 12/02 (2006.01)
G11C 16/22 (2006.01)

(52) U.S. Cl.
CPC ......... G06F 12/0246 (2013.01); G11C 16/225 (2013.01)

(58) Field of Classification Search
CPC .. G06F 12/0246; G06F 12/02; G11C 16/225
USPC ....................................................... 711/103
See application file for complete search history.

(56) References Cited

U.S. PATENT DOCUMENTS

2004/0193817 A1* 9/2004 Hotaka ............... G11C 16/225
711/163

FOREIGN PATENT DOCUMENTS

| JP | 5-128016 A | 5/1993 |
| JP | 05-265881 A | 10/1993 |
| JP | 8-022422 A | 1/1996 |
| JP | 11-231965 A | 8/1999 |
| JP | 2006-155735 A | 6/2006 |
| JP | 2009-086980 A | 4/2009 |
| JP | 2010-108253 A | 5/2010 |

OTHER PUBLICATIONS

Chinese Office Action issued in Chinese Application No. 201180068920.1 dated Jun. 26, 2015, with English Translation.
International Search Report in PCT/JP2011/055059 dated May 17, 2011 with English Translation.
Japanese Office Action issued in Japanese Application No. 2013-503245 dated May 7, 2014, w/English translation.

* cited by examiner

Primary Examiner — Matthew Bradley
(74) Attorney, Agent, or Firm — McDermott Will & Emery LLP

(57) ABSTRACT

In an internal register, a value for controlling operation of a flash memory is stored. A power shutoff detection register holds a value which changes when power shutoff occurs, and data stored in a specific memory cell is written in the power shutoff detection register. An EX-OR circuit compares the data stored in the specific memory cell with the value of the power shutoff detection register to thereby detect power shutoff. When power shutoff is detected, the value of the internal register is re-set. Thus, when power shutoff occurs, the flash memory can be prevented from malfunctioning.

10 Claims, 12 Drawing Sheets

POWER SHUTOFF DETECTION REGISTER AND
MEMORY CELL VALUE ARE COMPARED WITH
EACH OTHER IN ALL SEQUENCES

SEMICONDUCTOR DEVICE WITH NONVOLATILE MEMORY PREVENTED FROM MALFUNCTIONING CAUSED BY MOMENTARY POWER INTERRUPTION

RELATED APPLICATIONS

This application is the U.S. National Phase under 35 U.S.C. §371 of International Application No. PCT/JP2011/055059, filed on Mar. 4, 2011, the disclosure of which the Application is incorporated by reference herein.

TECHNICAL FIELD

The present invention relates to a semiconductor device including a nonvolatile memory, and particularly to a semiconductor device in which a nonvolatile memory is prevented from malfunctioning which is caused by momentary power interruption or the like.

BACKGROUND ART

In recent years, an increasing number of information terminals such as mobile phone and personal computer has become equipped with nonvolatile memories such as flash memory, and accordingly development of microcomputers and SoC (System on Chip) equipped with nonvolatile memories has advanced.

Such a nonvolatile memory, particularly flash memory, requires a high voltage to be generated when memory data is to be rewritten, and is thus mounted with an internal register in which information about a high voltage level at the time of rewriting is set. In addition, it is mounted with an address latch circuit in which information about a memory address of a memory cell to be rewritten is stored and, depending on this information, a word line of the memory cell to be rewritten is selected.

If momentary power interruption or the like occurs at the time when memory data of the flash memory is to be rewritten, the information about the high voltage level stored in the internal register and/or the information about the memory address stored in the address latch circuit may be broken.

At this time, if the system cannot detect the momentary power interruption, it cannot know the fact that the high voltage level information and/or the memory address information in the flash memory has been broken, and therefore, generation of an abnormal rewrite voltage, erroneous writing into a memory cell other than the memory cell to be rewritten, or the like, may cause the memory data to be broken. As technologies relevant to this, inventions are disclosed in Patent Documents PTDs 1 to 2 referenced below.

PTD 1 aims to provide a microcomputer capable of recovering a high-speed operation in a short time even if momentary power interruption occurs during the high speed operation. After powered up, the microcomputer examines a value of a comparison register. If the comparison register is not set to a specified value, the specified value is set in the comparison register, and selection data for selecting a ceramic oscillator is simultaneously set in an oscillation selection register and an auxiliary register. In contrast, if momentary power interruption occurs while the comparison register is set to the specified value, the value of the auxiliary register is set in the oscillation selection register 13.

PTD 2 has the following problem to be solved. In the case where a main memory is entirely constituted of nonvolatile memories and sudden power shutoff occurs, the system cannot normally resume its operation when re-powered up. The device includes an abnormal power shutoff determination unit and an abnormal power termination notification register. When the device is powered up, the abnormal power shutoff determination unit refers to the abnormal power termination notification register. When the abnormal power termination notification register stores information which indicates that the power supply for the device has abnormally been shut off and the processor is not a nonvolatile processor, the determination unit restarts the process which was executed before the shutoff of the power supply for the device and examines a device driver. When the abnormal power termination notification register stores information which indicates that the power supply for the device has abnormally been shut off and the processor is a nonvolatile processor, the determination unit restarts the process which was executed before the shutoff of the power supply for the device, from interrupted processing, and examines the device driver.

CITATION LIST

Patent Document

PTD 1: Japanese Patent Laying-Open No. 11-231965
PTD 2: Japanese Patent Laying-Open No. 2010-108253

SUMMARY OF INVENTION

Technical Problem

As described above, there has been a problem that, if the system cannot detect momentary power interruption, memory data may be broken due to generation of an abnormal rewrite voltage, erroneous writing into a memory cell other than the memory cell to be written, or the like.

According to PTD 1, the comparison register detects occurrence of momentary power interruption to thereby allow a high speed operation to be recovered. PTD 1, however, does not disclose the relation between the comparison register and malfunction of a nonvolatile memory, and therefore cannot solve the above problem.

According to PTD 2, the abnormal power termination notification register determines whether or not the power supply has abnormally been shut off and accordingly the process is restarted or resumed. Like PTD 1, PTD 2 does not disclose the relation between the abnormal power termination notification register and malfunction of the nonvolatile memory, and therefore cannot solve the above problem.

The present invention has been made to solve the aforementioned problem, and an object of the invention is to provide a semiconductor device in which a nonvolatile memory is prevented from malfunctioning when power shutoff occurs.

Solution to Problem

In accordance with an embodiment of the present invention, a semiconductor device including a flash memory is provided. The semiconductor device includes: an internal register storing a value for controlling an operation of the flash memory; a power shutoff detection register holding a value which changes when power shutoff occurs; and a control logic circuit for controlling the operation of the flash memory in accordance with the value stored in the internal register. The control logic circuit re-sets the value of the internal register when the control logic circuit detects power shutoff based on a change of the value held in the power shutoff detection register.

Advantageous Effects of Invention

In accordance with an embodiment of the present invention, the control logic circuit re-sets the value of the internal register when the control logic circuit detects power shutoff based on a change of the value held in the power shutoff detection register, and therefore, when power shutoff occurs, malfunction of the flash memory can be prevented.

DESCRIPTION OF EMBODIMENTS

Figure 1:
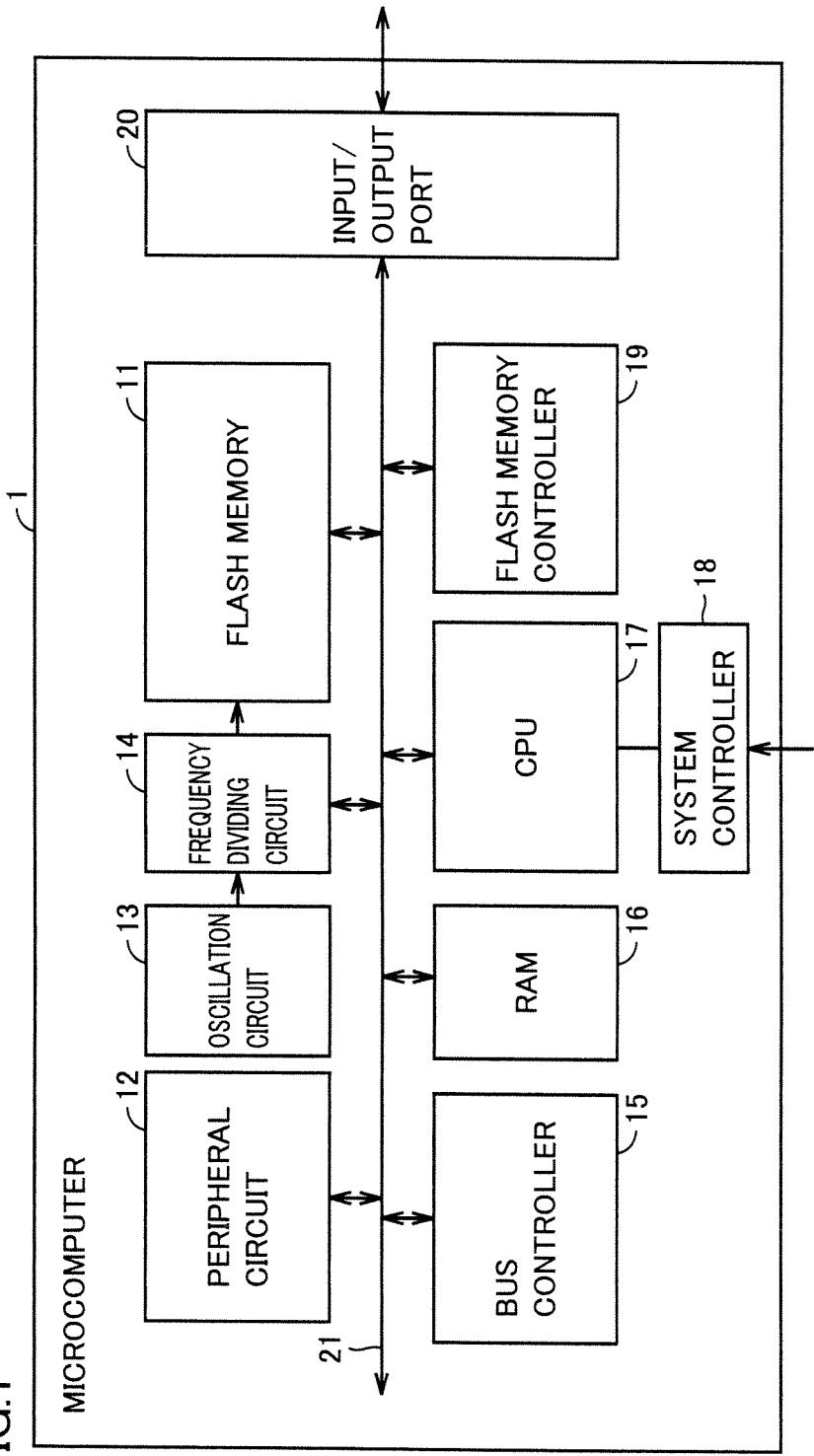
FIG. 1 is a diagram showing a configuration of a microcomputer which is an example of a system including a flash memory in an embodiment of the present invention.

FIG. 1 is a diagram showing a configuration of a microcomputer which is an example of a system including a flash memory in an embodiment of the present invention. This microcomputer 1 includes a flash memory 11, a peripheral circuit 12, an oscillation circuit 13, a frequency dividing circuit 14, a bus controller 15, a RAM (Random Access Memory) 16, a CPU (Central Processing Unit) 17, a system controller 18, a flash memory controller 19, and an input/output port 20.

Frequency dividing circuit 14 divides the frequency of an original oscillation signal which is output from oscillation circuit 13, and supplies the resultant signal as a clock signal to, for example, flash memory 11, peripheral circuit 12, bus controller 15, RAM 16, CPU 17, flash memory controller 19, and input/output port 20.

Flash memory 11 has a capability, as described later herein, of using a power shutoff detection register to detect occurrence of power shutoff and thereby prevent malfunction, and chiefly stores, for example, programs executed by CPU 17 and data which is necessary for system setup.

System controller 18 receives instructions applied externally to microcomputer 1 and controls CPU 17 in accordance with the instructions. In accordance with instructions from system controller 18, CPU 17 controls the whole of microcomputer 1. For example, CPU 17 loads a program stored in flash memory 11 into RAM 16 and executes the program to thereby control the whole of microcomputer 1.

Bus controller 15 controls, in response to a request for access made by CPU 17 which serves as a bus master, access to flash memory 11, peripheral circuit 12, RAM 16, and input/output port 20, for example, that are connected to a system bus 21.

In the case where microcomputer 1 is equipped with a DMA (Direct Memory Access) controller, bus controller 15 also controls bus access required by DMA transfer between memories and DMA transfer between a memory and an I/O (Input/Output) port of peripheral circuit 12 for example.

Flash memory controller 19 controls flash memory 11 in response to a request for access made by CPU 17.

Peripheral circuit 12 is made up of functional blocks such as a UART (Universal Asynchronous Receiver-Transmitter) and a timer. Input/output port 20 controls input and output of data to and from an I/O device which is provided outside microcomputer 1.

Figure 2:
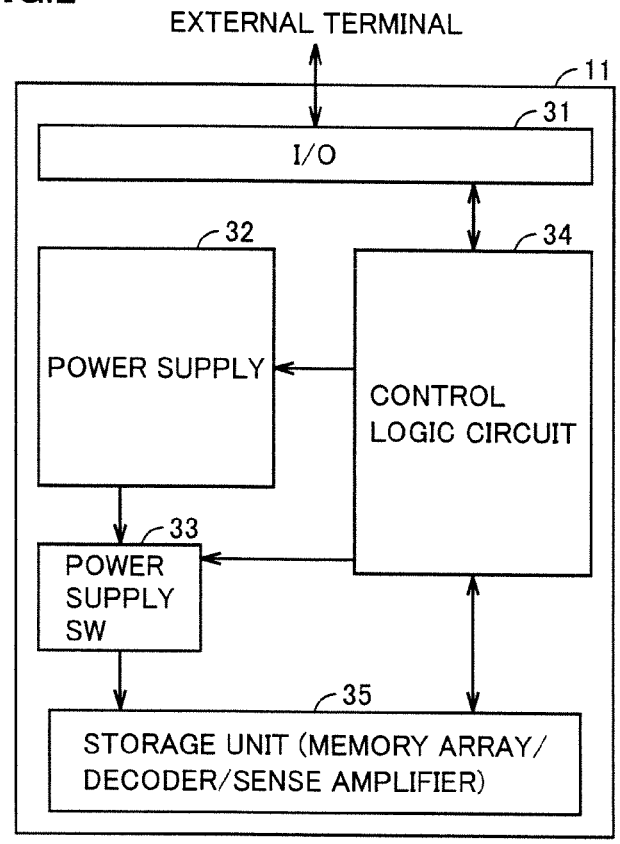
FIG. 2 is a block diagram showing a schematic configuration of flash memory 11 in the embodiment of the present invention.

FIG. 2 is a block diagram showing a schematic configuration of flash memory 11 in the embodiment of the present invention. Flash memory 11 includes an I/O 31, a power supply 32, a power supply switch (sw) 33, a control logic circuit 34, and a storage unit (memory array/decoder/sense amplifier) 35.

I/O 31 is connected to system bus 21 and performs input of a memory address, input/output of data, and input of a control signal, for example. In the case where flash memory 11 is provided as a separate semiconductor device, I/O 11 is connected to an external terminal.

Control logic circuit 34 has an internal register, an address latch circuit, and a power shutoff detection register, for example, as described later herein, and controls data rewrite and data read for example in response to a command received via I/O 31.

For example, in the case where control logic circuit 34 receives a data rewrite command, control logic circuit 34 causes power supply 32 to generate a high voltage for rewriting data, in accordance with information about setting of a high voltage level which is set in the internal register, and also controls power supply sw 33 to cause storage unit 35 to apply a rewrite pulse. At this time, control logic circuit 34 outputs a memory address stored in the address latch circuit to storage unit 35 to rewrite data in a memory cell which is to be rewritten.

Power supply 32 has a charge pump for generating a high voltage at the time of data rewrite for example, and is controlled by control logic circuit 34 to boost a power supply voltage for rewriting data and apply a rewrite pulse to storage unit 35 via power supply sw 33.

Storage unit 35 is made up of a memory array, a decoder, and a sense amplifier, for example. When data is to be rewritten, the decoder decodes an address which is output from the address latch circuit to thereby select a memory cell to be rewritten. Then, in accordance with the rewrite pulse applied via power supply sw 33, data is written in the memory cell to be rewritten.

In addition, storage unit 35 operates in the following way when data is to be read. Specifically, the decoder decodes an address which is output from the address latch circuit to thereby select a memory cell to be read. Data stored in the selected memory cell is then amplified by the sense amplifier and thus the data is read.

Figure 3:
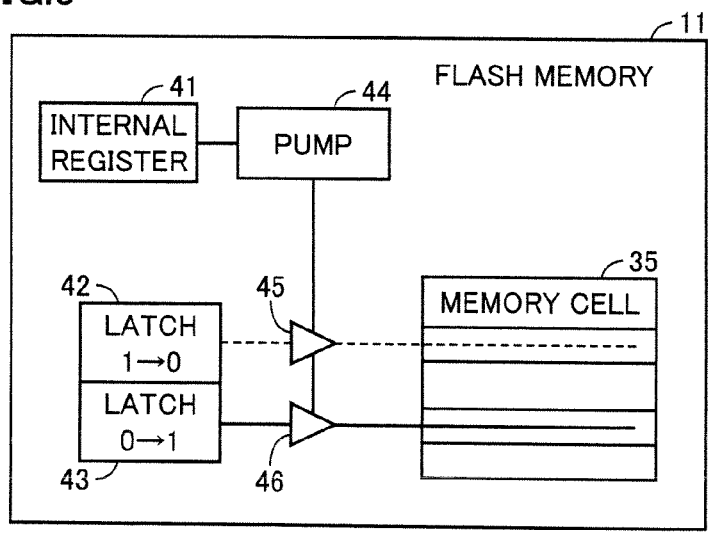
FIG. 3 is a diagram for illustrating a rewrite operation error that occurs when power is shut off.

FIG. 3 is a diagram for illustrating a rewrite operation error that occurs when power is shut off. Flash memory 11 includes an internal register 41 in which a value is set for controlling operation of flash memory 11, address latch circuits 42 and 43, a charge pump 44 supplying a write voltage to a memory cell at the time of write operation, buffers 45 and 46, and storage unit 35.

When data of flash memory 11 is to be rewritten, charge pump 44 boosts a power supply voltage in accordance with information about setting of a high voltage that is stored in internal register 41, and supplies the boosted power supply voltage to buffers 45 and 46.

Address latch circuits 42 and 43 store an address that is externally input via I/O 31 and outputs the address to buffers 45 and 46. Buffers 45 and 46 output the voltage boosted by charge pump 44, and select a memory cell to be rewritten. The number of address latch circuits and the number of buffers herein correspond to the number of addresses.

Here, if momentary power interruption or sudden power shutoff occurs to cause data stored in internal register 41 or address information stored in address latch circuits 42 and 43 to be broken, there is a possibility that data is rewritten with a voltage different from the information about setting of the high voltage which is set in advance, or that a memory cell different from the memory cell to be rewritten is selected.

First Embodiment

Figure 4:
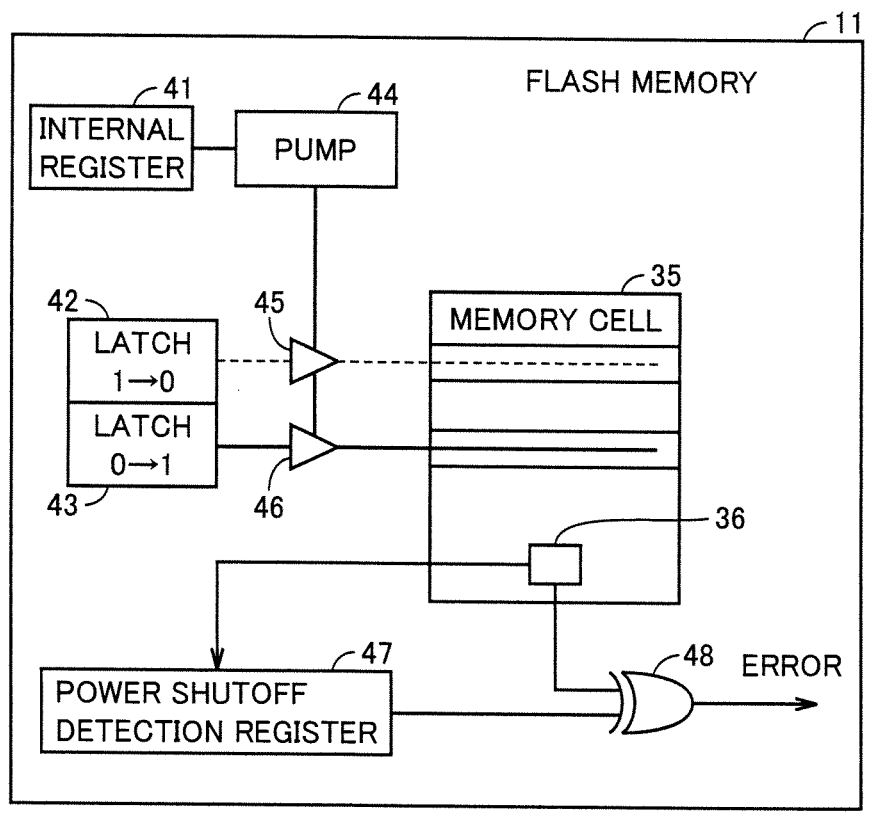
FIG. 4 is a diagram showing an example configuration of flash memory 11 in a first embodiment of the present invention.

FIG. 4 is a diagram showing an example configuration of flash memory 11 in a first embodiment of the present invention. Flash memory 11 includes internal register 41 in which a value is set for controlling operation of flash memory 11, address latch circuits 42 and 43, charge pump 44, buffers 45 and 46, a power shutoff detection register 47, an EX-OR (exclusive OR) circuit 48, and storage unit 35. Any component which is identical in configuration and capability to that of the flash memory shown in FIG. 3 will be denoted by the same reference character.

When initial settings are done by microcomputer 1, data of a specific memory cell 36 in storage unit 35 is read and set in power shutoff detection register 47. This power shutoff detection register 47 is configured so that a value held therein is more prone to change relative to internal register 41 or address latch circuit 42 and 43 for example when power shutoff occurs, as described later herein. Namely, this register is configured so that the change of the value stored therein is sensitive to momentary power interruption or power shutoff. Since power shutoff detection register 47 is thus configured, respective values of power shutoff detection register 47 and memory cell 36 which is a nonvolatile cell do not match each other when power shutoff occurs, and accordingly an ERROR signal which is an output of EX-OR circuit 48 is caused to change from a low level (hereinafter abbreviated as L level) to a high level (hereinafter abbreviated as H level).

Control logic circuit 34 examines the ERROR signal before and after a PP (PRG pulse sequence) and an EP (ERS pulse sequence) included in a data rewrite sequence. When control logic circuit 34 detects power shutoff, it outputs a power shutoff detection error flag to an external component which is CPU 17 for example.

Figure 15:
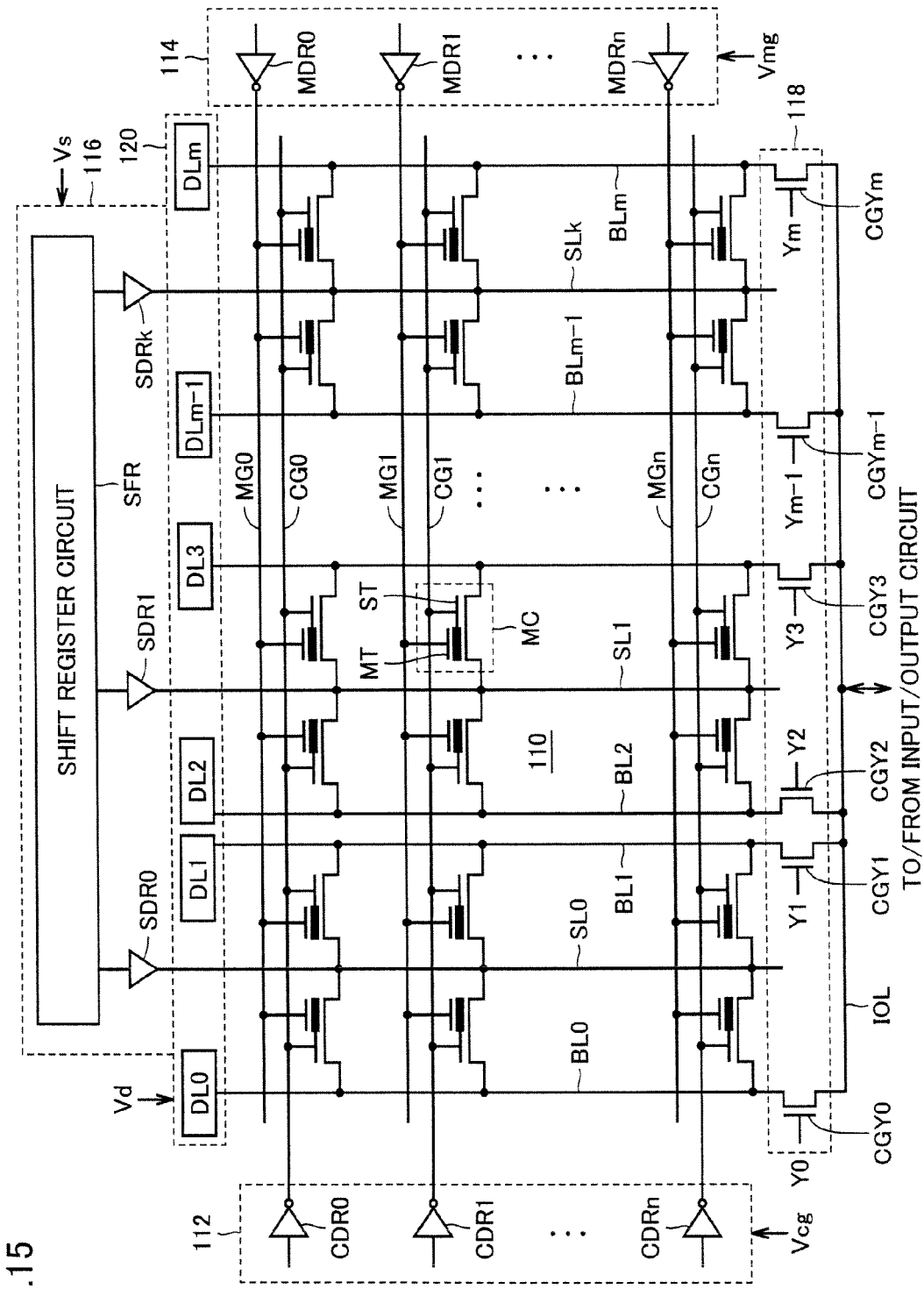
FIG. 15 is a diagram showing a memory cell configuration of a memory unit 35 in flash memory 11.

FIG. 15 is a diagram showing a memory cell configuration of memory unit 35 in flash memory 11. In a memory cell array 110, memory cells MC are arranged in rows and columns. This memory cell MC includes a select transistor ST and a memory cell transistor MT. In FIG. 15, a charge storage film of memory cell transistor MT is indicated by a bold line.

Memory gate lines MG0 to MGn and control gate lines CG0 to CGn are provided for respective corresponding rows of memory cells MC. Memory gate lines MG0 to MGn are connected to gates (memory cell gate electrodes) of memory cell transistors MT of respective corresponding rows. Control gate lines CG0 to CGn are connected to gates (control gate electrodes) of select transistors ST of memory cells MC of respective corresponding rows.

Bit lines BL0 to BLm are arranged for respective corresponding memory cell columns Source lines SL0 to SLk are arranged in such a manner that each source line is shared by memory cells MC of adjacent columns. Here, k=m/2. Bit lines BL0 to BLm are connected to first conductive nodes (impurity regions) of select transistors of memory cells of respective corresponding columns Source lines SL0 to SLk are connected to second conductive nodes (impurity regions) of memory cell transistors MT of memory cells MC of respective corresponding columns.

In FIG. 15, the source lines are each shown to be shared by memory cells of adjacent columns. However, local source lines may be arranged for respective corresponding memory cell columns and the local source lines of a group of a predetermined number of memory cell columns may be connected to a common source line. In the case of this source line arrangement, data is written for each common source line.

A control gate line select drive circuit 112 includes control gate line drivers CDR0 to CDRn provided for respective corresponding control gate lines CG0 to CGn. These control gate line drivers CDR0 to CDRn transmit a select/non-select voltage to respective corresponding control gate lines, in accordance with a row designation signal (decode signal) from a decode circuit (not shown) included in control gate line select drive circuit 112. Control gate line drivers CDR0 to CDRn receive a control gate line voltage Vcg as an operation power supply voltage.

A memory gate line select drive circuit 114 includes memory gate line drivers MDR0 to MDRn provided for respective corresponding memory gate lines MG0 to MGn. Memory gate line select drive circuit 114 also transmits a memory gate line voltage Vmg of a select or non-select voltage level to respective corresponding memory gate lines, in accordance with a row designation signal (decode signal) from a decode circuit (not shown).

A source line select drive circuit 116 includes a shift register circuit SFR performing a shift operation in accordance with a shift clock signal (not shown), and source line drivers SDR0 to SDRk provided for respective corresponding source lines SL0 to SLk. This shift register circuit SFR drives its output successively to a select state in accordance with a shift clock signal (not shown) when data is to be written. Source line drivers SDR0 to SDRk drive, in accordance with an output signal from respective corresponding output nodes of shift register circuit SFR, respective corresponding source lines SL0 to SLk successively to a select state.

A column select circuit 118 includes column select gates CGY0 to CGYm provided for respective corresponding bit lines BL0 to BLm. These column select gates CGY0 to CGYm are made electrically conductive in accordance with column select signals Y0 to Ym from a column decoder (not shown, included in column select circuit 118). When conductive, column select gates CGY0 to CGYm couple respective corresponding bit lines BL (BL0 to BLm) to an internal data line IOL.

A data latch circuit 120 includes data latches DL0 to DLm provided for respective corresponding bit lines BL0 to BLm. These data latches DL0 to DLm latch data transmitted to respective corresponding bit lines when data is to be written. In accordance with these latched data, data latches DL0 to DLm receive a bit line voltage Vd as an operation power supply voltage and, when data is to be written, transmit a write voltage or a write inhibit voltage to respective corresponding bit lines.

Figure 5:
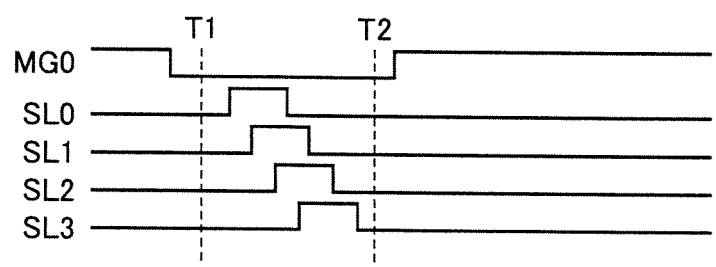
FIG. 5 is a timing chart for illustrating detection of power shutoff in an erase pulse sequence of flash memory 11.

FIG. 5 is a timing chart for illustrating detection of power shutoff in an EP (ERS pulse sequence) included in a data rewrite sequence of flash memory 11. For example, in the memory cell configuration shown in FIG. 15, when memory cells connected to memory gate line MG0 and source lines SL0 to SL3 are to be erased, memory gate line driver MDR0 drives memory gate MG0 to L level and source line drivers SDR0 to SDR3 drive source lines SL0 to SL3 successively to H level.

As shown in FIG. 5, before and after the EP (ERS pulse sequence) in which memory gate MG0 is driven to L level and source lines SL0 to SL3 are driven successively to H level, namely at timings T1 and T2, power shutoff detection error is determined, namely a comparison is made between a value of power shutoff detection register 47 and a value of memory cell 36. More specifically, control can be performed at the timing when the value of memory cell 36 is read or the timing at which EX-OR circuit 48 is activated. Control logic circuit 34 examines the ERROR signal. When the value of the signal is "1", control logic circuit 34 outputs a power shutoff detection error flag to CPU 17.

CPU 17 detects occurrence of power shutoff by detecting that the power shutoff detection error flag which is output from flash memory 11 is activated, and stores an error flag value in, for example, a power shutoff register of CPU 17.

Figure 6:
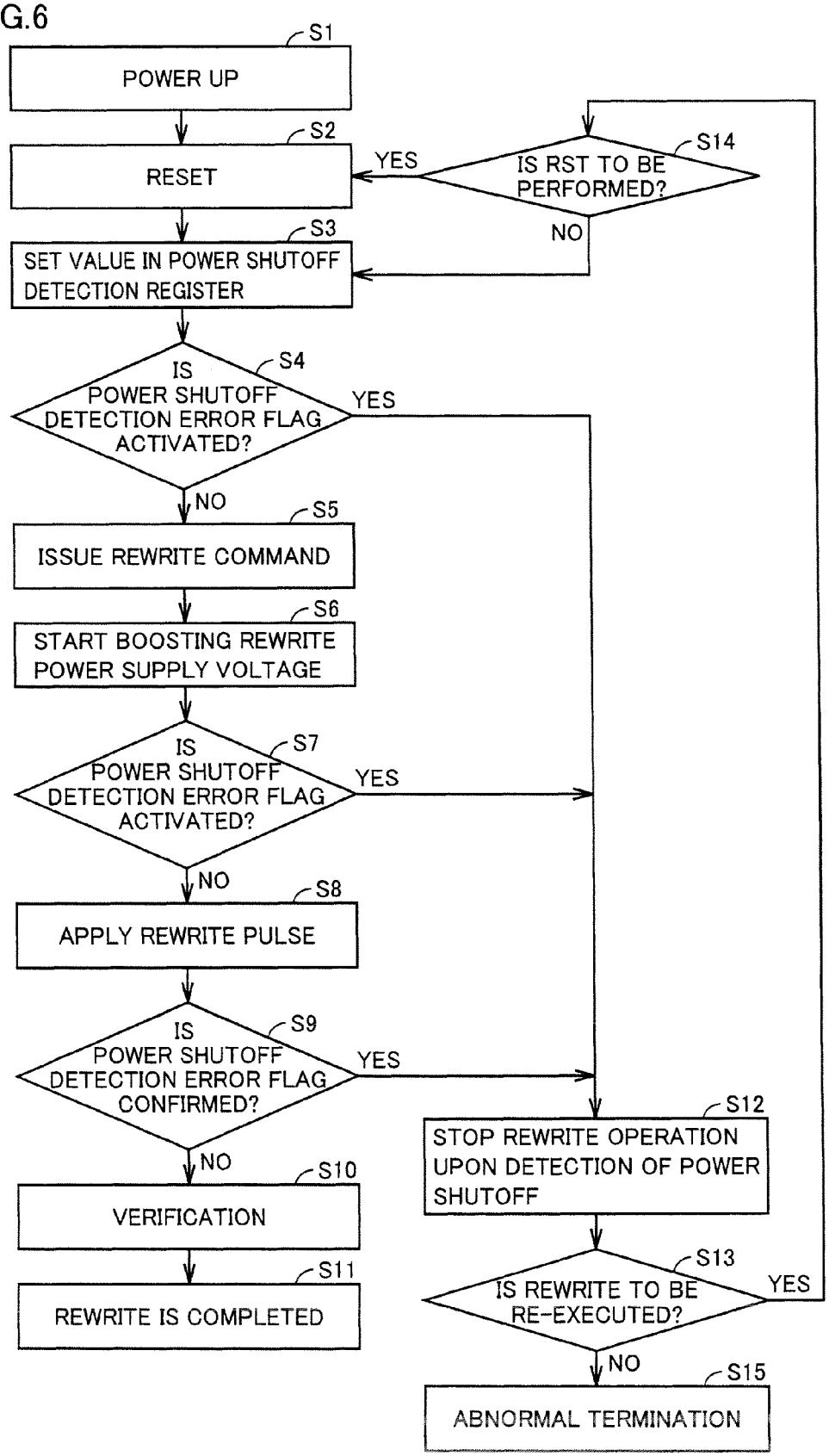
FIG. 6 is a flowchart showing an example of power shutoff detection by flash memory 11 in the first embodiment of the present invention.

FIG. 6 is a flowchart showing an example of power shutoff detection by flash memory 11 in the first embodiment of the present invention. First, microcomputer 1 is powered up (S1) and the system is reset (S2). Then, control logic circuit 34 reads a value of memory cell 36 in storage unit 35 and sets the value in power shutoff detection register 47 (S3).

Next, control logic circuit 34 determines whether or not the power shutoff detection error flag is activated (S4). When the power shutoff detection error flag is activated (S4, YES), the process proceeds to step S12.

When the power shutoff detection error flag is not activated (S4, NO) and a rewrite command is issued from CPU 17 (S5), control logic circuit 34 controls power supply 32 so that boosting of a rewrite power supply voltage is started (S6).

Then, control logic circuit 34 determines again whether or not the power shutoff detection error flag is activated (S7).

When the power shutoff detection error flag is activated (S7, YES), the process proceeds to step S12.

When the power shutoff detection error flag is not activated (S7, NO), control logic circuit 34 applies a rewrite pulse to the memory cell to be rewritten to thereby rewrite data (S8).

Then, control logic circuit 34 determines again whether or not the power shutoff detection error flag is activated (S9). When the power shutoff detection error flag is activated (S9, YES), the process proceeds to step S12.

When the power shutoff detection error flag is not activated (S9, NO), control logic circuit 34 performs verification (S10) and completes the data rewrite operation (S11).

When the power shutoff detection error flag is activated, control logic circuit 34 stops the data rewrite operation (S12), and determines whether to re-execute the data rewrite operation or not (S13). For example, flash memory 11 is provided with a re-execution setting register for setting therein, at the time of initial settings, whether re-execution is to be done or not, and CPU 17 sets whether re-execution is to be done or not to the re-execution setting register.

Alternatively, when CPU 17 receives the power shutoff detection error flag from flash memory 11, CPU 17 may re-issue the rewrite command to flash memory 11 so that the data rewrite operation is re-executed.

When the data rewrite operation is not to be re-executed (S13, NO), an abnormal termination is done (S15). When the data rewrite operation is to be re-executed (S13, YES) and flash memory 11 is reset again (S14, YES), the process is repeated from step S2. When flash memory 11 is not reset again (S14, NO), the process is repeated from step S3.

Figure 7:
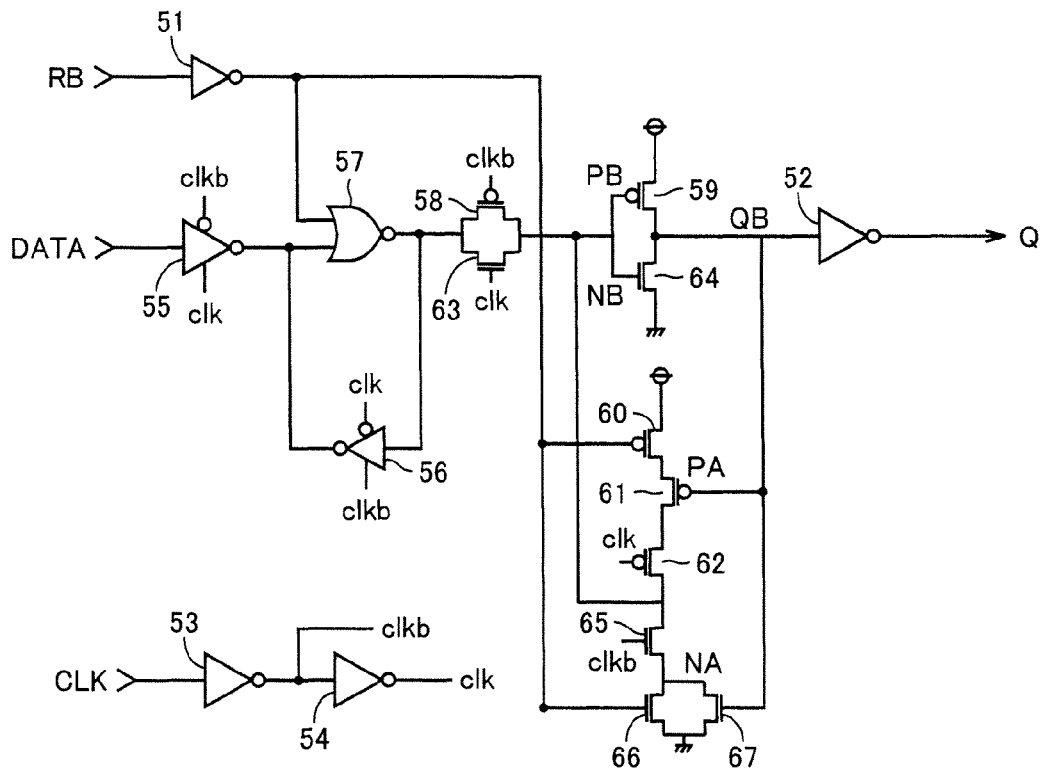
FIG. 7 is a diagram showing an example internal configuration of an internal register 41 and a power shutoff detection register 47.

FIG. 7 is a diagram showing an example of an internal configuration of internal register 41 and power shutoff detection register 47 shown in FIG. 4. These registers include inverters 51 to 56, an NOR circuit 57, P-channel MOS (Metal Oxide Semiconductor) transistors 58 to 62, and N-channel MOS transistors 63 to 67. The CLK signal shown in FIG. 7 is a signal for specifying the timing at which data is taken in the register.

For example, when "1" is to be set in the register, DATA is first set to H level and CLK is set to H level. An RB receiving a reset signal for resetting the register is L level. At this time, P-channel MOS transistor 58 and N-channel MOS transistor 63 are turned ON and the value of DATA is given to respective gates of P-channel MOS transistor 59 (hereinafter also referred to as PB 59) and N-channel MOS transistor 64 (hereinafter also referred to as NB 64).

At this time, PB 59 is OFF and NB 64 is ON. Therefore, a QB node has L level and H level is output to Q, which is an output of inverter 52. P-channel MOS transistor 61 (hereinafter also referred to as PA 61) is turned ON and N-channel MOS transistor 67 (hereinafter also referred to as NA 67) is turned OFF.

After this, when CLK is set to L level, P-channel MOS transistor 58 and N-channel MOS transistor 63 are turned OFF. However, P-channel MOS transistor 62 is turned ON so that the H level applied to the gates of PB 59 and NB 64 is maintained. As a result, the H level which is output to Q is maintained.

As described above, it is necessary to configure power shutoff detection register 47 so that the value held in the register is more prone to change when power shutoff occurs, relative to internal register 41 or address latch circuit 42 and 43 for example. Accordingly, in the case for example where the power shutoff detection register is configured by the circuit shown in FIG. 7, the gate width of PB 59 and NA 67 is widened to enhance the drive ability and the gate width of PA 61 and NB 64 is narrowed to lower the drive ability.

In the case where the register is configured in this way, when power shutoff occurs to cause the power supply voltage to have an intermediate level and cause PB 59 and NB 64 to be turned ON simultaneously while power shutoff detection register 47 holds "1", the QB node is driven to H level since PB 59 is higher in drive ability than NB 64. Consequently, Q, which is the output of inverter 52, is changed to L level.

Likewise, in the case where PA 61 and NA 67 are turned ON simultaneously, the gates of PB 59 and NB 64 are driven to L level since NA 67 is higher in drive ability than PA 61. Consequently, H level of the QB node is maintained and L level of Q which is the output of inverter 52 is maintained.

It is also possible, in the case where the power shutoff detection register is to be configured, to narrow the gate width of PB 59 and NA 67 to thereby lower the drive ability and widen the gate width of PA 61 and NB 64 to enhance the drive ability.

In the case where the register is configured in this way, when power shutoff occurs to cause the power supply voltage to have an intermediate level and cause PB 59 and NB 64 to be turned ON simultaneously while power shutoff detection register 47 holds "0", the QB node is driven to L level since PB 59 is lower in drive ability than NB 64. Consequently, Q, which is the output of inverter 52, is changed to H level.

Likewise, in the case where PA 61 and NA 67 are turned ON simultaneously, the gates of PB 59 and NB 64 are driven to H level since NA 67 is lower in drive ability than PA 61. Consequently, L level of the QB node is maintained and H level of Q which is the output of inverter 52 is maintained.

Thus, the imbalance of the size, particularly the gate width, between transistors of power shutoff detection register 47 makes it possible to configure the register having an increased VDDmin level (high Vth) and configure the register so that it is more sensitive to power shutoff than internal register 41 or address latch circuit 42 and 43.

It is also possible to configure power shutoff detection register 47 by adding to the QB node a load capacitor which becomes effective when it has a level different from data which is set in power shutoff detection register 47. For example, one terminal of the load capacitor is connected to the QB node and the other terminal is connected to VDD or GND. Accordingly, when power shutoff occurs while power shutoff detection register 47 holds "1", the value of power shutoff detection register 47 is more prone to change to "0". On the contrary, when power shutoff occurs while power shutoff detection register 47 holds "0", the value of power shutoff detection register is more prone to change to "1".

Power shutoff detection register 47 may also be configured so that the transistors thereof, particularly the transistors constituting the latches, are thick-film transistors or the like having high Vth that are used, for example, in a high voltage control circuit or pump circuit in flash memory 11.

In addition, since many high voltage generation circuits use VCC power supply other than VDD power supply, a power shutoff detection register adapted to VCC power supply may be provided and occurrence of VCC power shutoff may be detected.

As described above, the semiconductor device in the present embodiment is configured in such a manner that power shutoff detection register 47 is provided and the data rewrite operation is stopped or re-executed when power shutoff is detected, and accordingly generation of an abnormal rewrite voltage, erroneous writing to a memory cell other than the memory cell to be rewritten, or the like, can be prevented, which enables a disturb operation to be avoided.

In addition, even in the case where local power shutoff, which cannot be detected by the system, occurs, flash memory 11 can detect the power shutoff to independently stop or re-execute the data rewrite operation.

In addition, since the power shutoff detection error flag is output to CPU 17 when flash memory 11 detects power shutoff, CPU 17 can also recognize occurrence of power shutoff and stoppage of data rewrite operation, for example, and thus the same command can be issued again to enable a desired rewrite operation to be performed.

Second Embodiment

The flash memory in the first embodiment of the present invention examines the ERROR signal before and after the PP and the EP that are included in the data rewrite sequence to thereby detect power shutoff. A flash memory in a second embodiment examines, at all times, the ERROR signal to detect power shutoff.

Respective configurations of microcomputer 1, flash memory 11, and power shutoff detection register 47 for example in the second embodiment of the present invention are similar to those described above in connection with the first embodiment. The detailed description of the same configurations and capabilities will therefore not be repeated.

Figure 8:
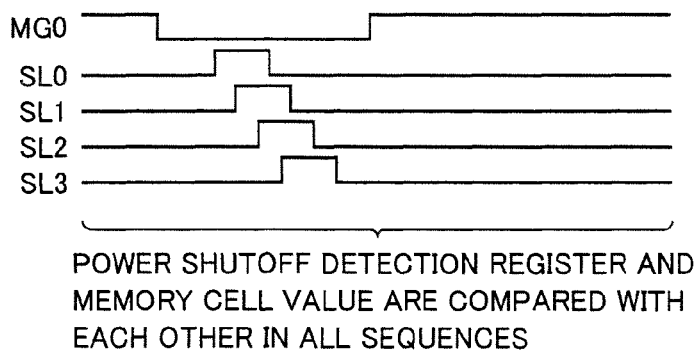
FIG. 8 is a timing chart for illustrating detection of power shutoff in an erase pulse sequence of flash memory 11.

FIG. 8 is a timing chart for illustrating detection of power shutoff in an erase pulse sequence of flash memory 11. As shown in FIG. 8, at all of the timings of the erase pulse sequence at which memory gate MG0 is set to L level and source lines SL0 to SL3 are successively set to H level, the value of memory cell 36 is read. Control logic circuit 34 examines the ERROR signal and, when the value of the signal is "1", it outputs the power shutoff detection error flag to CPU 17.

Figure 9:
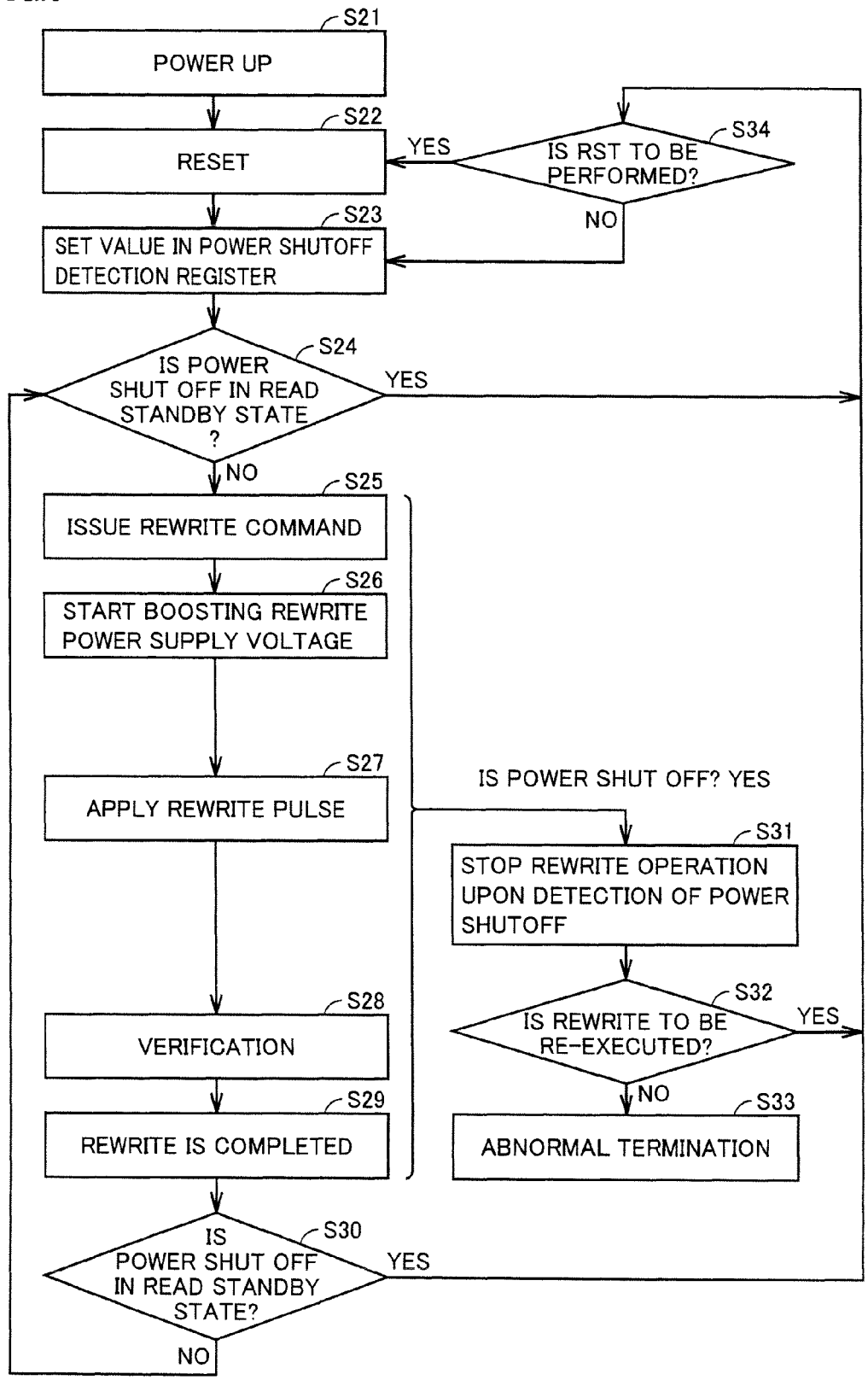
FIG. 9 is a flowchart showing an example of power shutoff detection by flash memory 11 in a second embodiment of the present invention.

FIG. 9 is a flowchart showing an example of power shutoff detection by flash memory 11 in the second embodiment of the present invention. First, microcomputer 1 is powered up (S21) and the system is reset (S22). Then, control logic circuit 34 reads a value of memory cell 36 in storage unit 35 and sets the value in power shutoff detection register 47 (S23).

Next, control logic circuit 34 determines whether or not the power shutoff detection error flag is activated in a read standby state (S24). When the power shutoff detection error flag is activated (S24, YES), the process proceeds to step S34.

When the power shutoff detection error flag is not activated (S24, NO) and a rewrite command is issued from CPU 17 (S25), control logic circuit 34 controls power supply 32 so that boosting of a rewrite power supply voltage is started (S26).

Next, control logic circuit 34 applies a rewrite pulse to a memory cell to be rewritten to thereby rewrite data (S27). Then, control logic circuit 34 performs verification (S28) and completes the data rewrite operation (S29).

Next, control logic circuit 34 determines whether or not the power shutoff detection error flag is activated in a read standby state (S30). When the power shutoff detection error flag is activated (S30, YES), the process proceeds to step S34. When the power shutoff detection error flag is not activated (S30, NO), the process proceeds to step S24.

Control logic circuit 34 determines, at all times in steps S25 to S29, whether or not the power shutoff detection error flag is activated. When the power shutoff detection error flag is activated, control logic circuit 34 stops the data rewrite operation (S31) and determines whether to re-execute the data rewrite operation or not (S32).

When the data rewrite operation is not re-executed (S32, NO), an abnormal termination is done (S33). When the data rewrite operation is re-executed (S32, YES) and flash memory 11 is reset again (S34, YES), the process is repeated from step S22. When flash memory 11 is not reset again (S34, NO), the process is repeated from step S23.

As described above, regarding flash memory 11 in the present embodiment, it is determined at all times whether or not the power shutoff detection error flag is activated to thereby detect power shutoff. Therefore, in addition to the effects described above in connection with the first embodiment, the effect is achieved that the data rewrite operation can be stopped when power shutoff occurs even during application of the rewrite pulse.

In addition, when CPU 1 receives the power shutoff detection error flag, the system is reset and the value of internal register 41 is initialized. Therefore, it has become possible to prevent flash memory 11 from malfunctioning due to breakage of the value stored in internal register 41.

Third Embodiment

Respective configurations of microcomputer 1, flash memory 11, and power shutoff detection register 47 for example in a third embodiment of the present invention are similar to those described above in connection with the first embodiment. The detailed description of the same configurations and capabilities will therefore not be repeated.

In flash memory 11 in the third embodiment of the present invention, control logic circuit 34 compares a value of power shutoff detection register 47 and a value of memory cell 36 to detect whether power shutoff occurs, upon receiving a power shutoff detection command from CPU 17.

As described above, regarding flash memory 11 in the present embodiment, whether or not power shutoff occurs is detected upon receipt of the power shutoff detection command from CPU 17. Therefore, the system can set the timing at which whether power shutoff occurs is detected and can determine whether it is necessary to examine the power shutoff detection, which enhances the degree of freedom of examination of the power shutoff detection.

Moreover, for the data rewrite operation, CPU 17 issues the power shutoff detection command in an appropriate sequence to detect whether power shutoff occurs, which makes it possible to execute an appropriate rewrite flow.

Fourth Embodiment

Respective configurations of microcomputer 1, flash memory 11, and power shutoff detection register 47 for example in a fourth embodiment of the present invention are similar to those described above in connection with the first embodiment. The detailed description of the same configurations and capabilities will therefore not be repeated.

In the first to third embodiments, at the time when microcomputer 1 makes initial settings, data of a specific memory cell 36 in storage unit 35 is read and set in power shutoff detection register 47. Regarding flash memory 11 in the fourth embodiment of the present invention, when the microcomputer is powered up and the system is reset, data of memory cell 36 is automatically transferred to power shutoff detection register 47 and the value of power shutoff detection register 47 and the value of memory cell 36 are compared with each other.

As described above, regarding flash memory 11 in the present embodiment, the value of memory cell 36 is automatically transferred to power shutoff detection register 47 upon resetting, which makes it unnecessary to read the value from memory cell 36 and write the value in power shutoff detection register 47. Accordingly, the operation can be simplified.

Fifth Embodiment

Respective configurations of microcomputer 1, flash memory 11, and power shutoff detection register 47 for example in a fifth embodiment of the present invention are similar to those described above in connection with the first embodiment, except for a difference that a ROM (Read Only Memory) is provided in flash memory 11 and data of a specific address of the ROM is read and set in power shutoff detection register 47 in the fifth embodiment. The detailed description of the same configurations and capabilities will therefore not be repeated.

Figure 10:
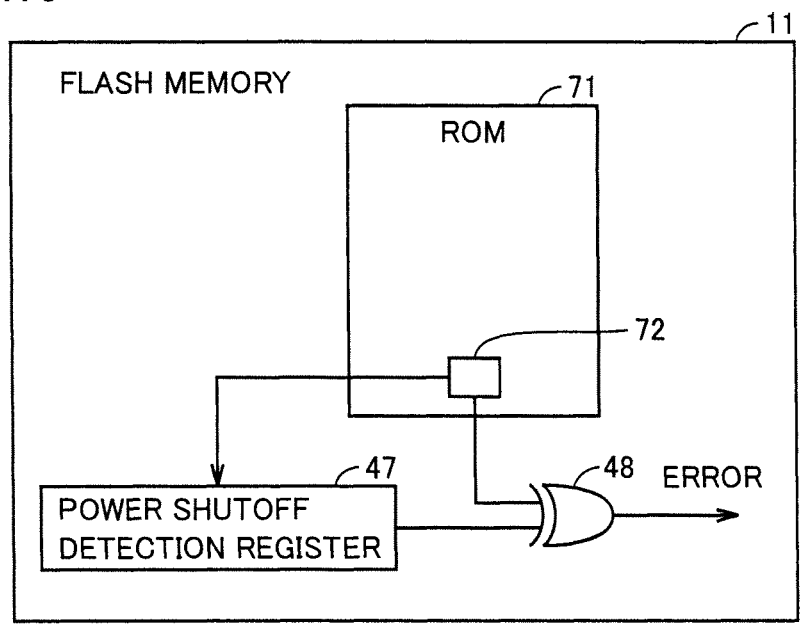
FIG. 10 is a diagram showing an example configuration of flash memory 11 in a fifth embodiment of the present invention.

FIG. 10 is a diagram showing an example configuration of flash memory 11 in the fifth embodiment of the present invention. Flash memory 11 includes power shutoff detection register 47, EX-OR circuit 48, and ROM 71. Any component which is identical in configuration and capability to that of the flash memory shown in FIG. 4 will be denoted by the same reference character.

When initial settings are done by microcomputer 1, data 72 of a specific address of ROM 71 is read and set in power shutoff detection register 47. Then, when power shutoff occurs, the value of power shutoff detection register 47 and data 72 of the specific address of ROM 71 do not match each other, and accordingly an ERROR signal which is an output of EX-OR circuit 48 is caused to change from L level to H level.

As described above, regarding flash memory 11 in the present embodiment, data 72 of a specific address of ROM 71 is read and set in power shutoff detection register 47, which makes it possible to achieve similar effects to those described in connection with the first embodiment.

Sixth Embodiment

Respective configurations of microcomputer 1, flash memory 11, and power shutoff detection register 47 for example in a sixth embodiment of the present invention are similar to those described above in connection with the first embodiment, except for a difference in configuration of a portion for detecting power shutoff in flash memory 11 in the sixth embodiment. The detailed description of the same configurations and capabilities will therefore not be repeated.

Figure 11:
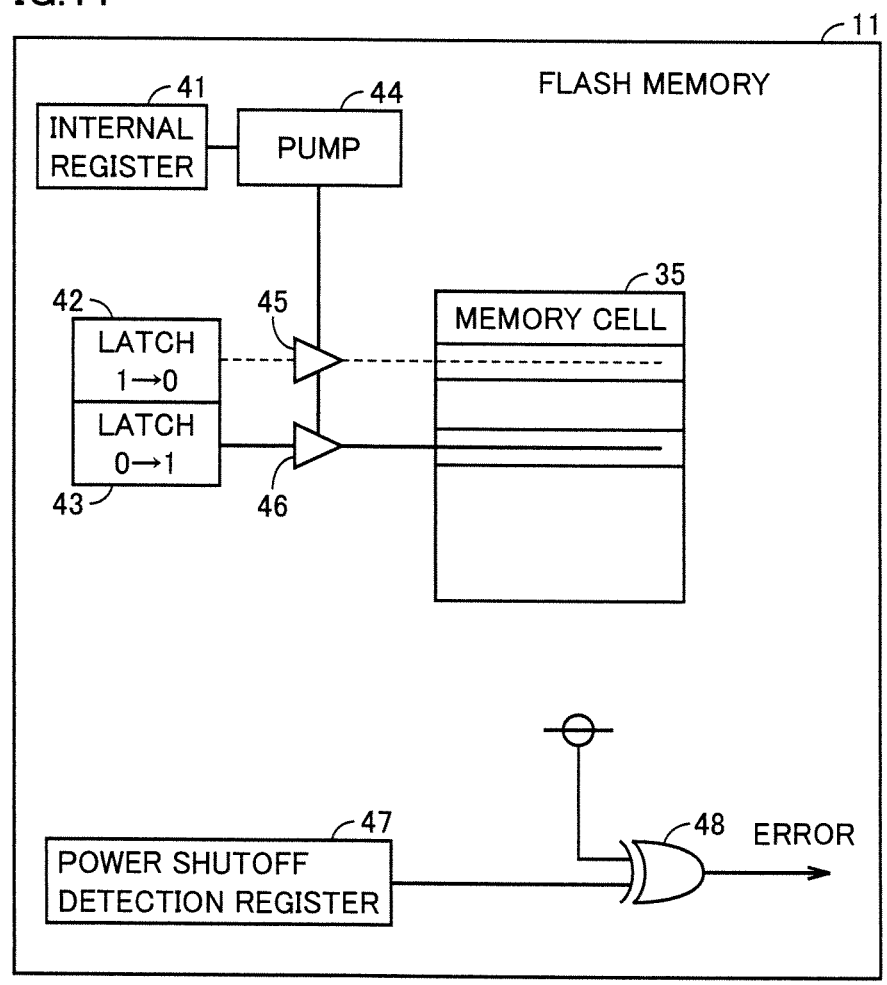
FIG. 11 is a diagram showing an example configuration of flash memory 11 in a sixth embodiment of the present invention.

FIG. 11 is a diagram showing an example configuration of flash memory 11 in the sixth embodiment of the present invention. Flash memory 11 includes internal register 41 in which a value is set for controlling operation of flash memory 11, address latch circuits 42 and 43, charge pump 44, buffers 45 and 46, power shutoff detection register 47, EX-OR circuit 48, and storage unit 35. Any component which is identical in configuration and capability to that of the flash memory shown in FIG. 4 will be denoted by the same reference character.

EX-OR circuit 48 has one terminal to which power supply VDD is connected and the other terminal to which an output of power shutoff detection register 47 is connected. In power shutoff detection register 47, "1" is set.

Alternatively, EX-OR circuit 48 may have one terminal to which VSS (GND) is connected and the other terminal to which an output of power shutoff detection register 47 is connected. In power shutoff detection register 47, "0" may be set.

As described above, regarding flash memory 11 in the present embodiment, EX-OR circuit 48 has one terminal to which VDD or VSS is connected and the other terminal to which the output of power shutoff detection register 47 is connected, and therefore, it is unnecessary to read data from a specific memory cell of storage unit 35 and compare the data with the output of power shutoff detection register 47. Accordingly, the operation can be simplified.

Seventh Embodiment

Respective configurations of microcomputer 1, flash memory 11, and power shutoff detection register 47 for example in a seventh embodiment of the present invention are similar to those described above in connection with the first embodiment, except for a difference that a plurality of power shutoff detection registers 47 are provided in flash memory 11 in the seventh embodiment. The detailed description of the same configurations and capabilities will therefore not be repeated.

A plurality of power shutoff detection registers 47 are arranged so that they are dispersed, and "0" is set in some registers and "1" is set in the remaining registers among the plurality of power shutoff detection registers 47. In a similar manner to that described above in connection with the first to sixth embodiments, power shutoff detection registers 47 are each compared with a value of a specific memory cell 36 of storage unit 35 or a value 72 of a specific address of ROM 71, to thereby detect whether power shutoff occurs or not.

As described above, regarding flash memory 11 in the present embodiment, a plurality of power shutoff detection registers 47 are provided and "0" is set in some registers and "1" is set in the remaining registers among power shutoff detection registers 47. Therefore, both the change of the value "0" set in some power shutoff detection registers to "1" and the change of the value "1" set in the remaining power shutoff detection registers to "0" can be detected, so that the accuracy of power shutoff detection can further be improved.

In addition, since a plurality of power shutoff detection registers 47 are arranged so that they are dispersed, detection of local power shutoff in flash memory 11 is facilitated.

Eighth Embodiment

Figure 12:
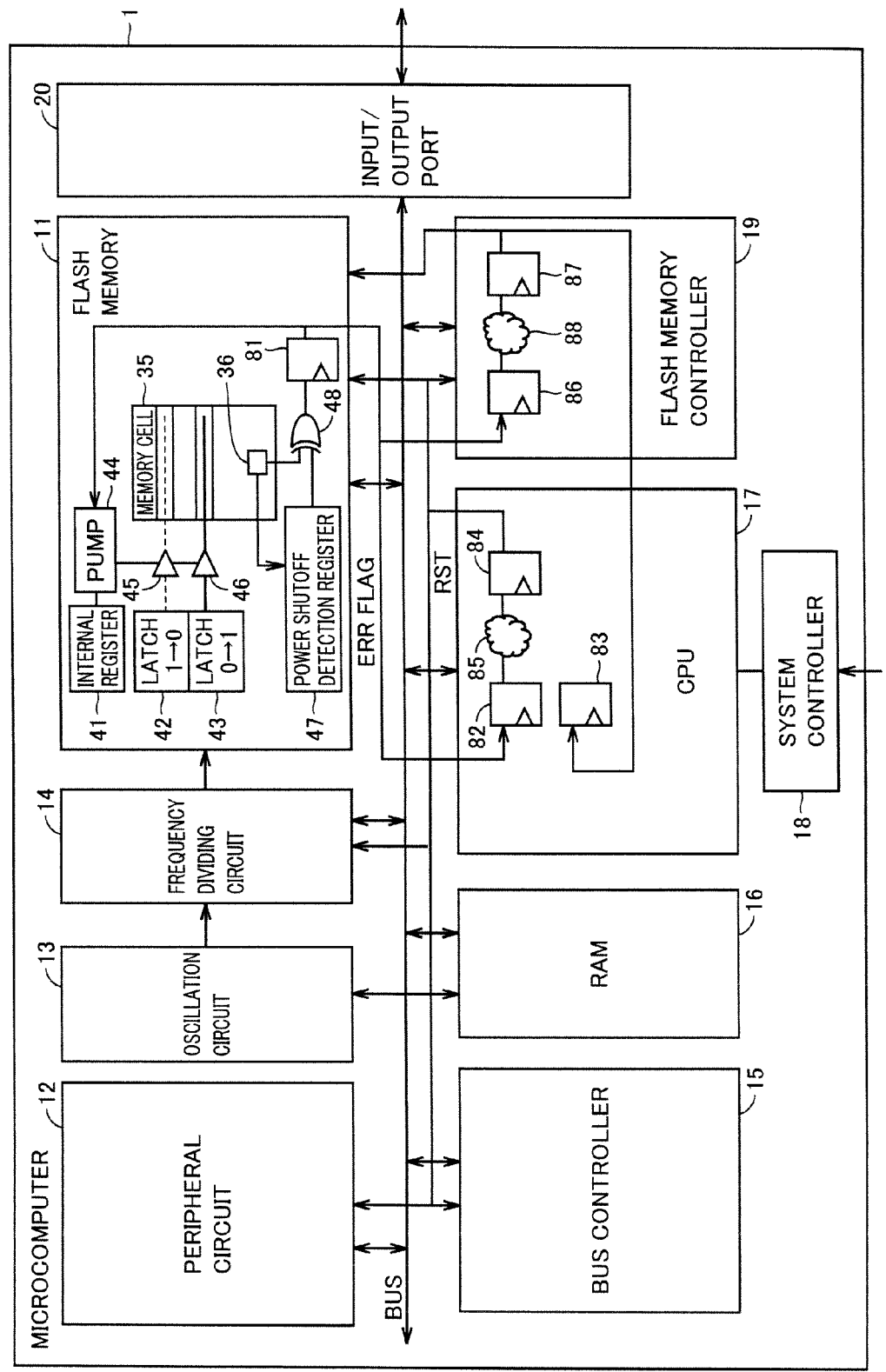
FIG. 12 is a block diagram showing an example configuration of microcomputer 1 including flash memory 11 in an eighth embodiment of the present invention.

FIG. 12 is a block diagram showing an example configuration of microcomputer 1 including flash memory 11 in an eighth embodiment of the present invention. Any component which is identical in configuration and capability to that of microcomputer 1 or flash memory 11 in the first embodiment will be denoted by the same reference character.

To flash memory 11, a flip-flop (hereinafter abbreviated as FF) 81 is added for holding an ERROR signal which is output from EX-OR circuit 48. This FF 81 (ERR flag register 81) outputs a power shutoff detection error flag to charge pump 44 and CPU 17.

To CPU 17, FF 82 to 84 and a combinational circuit 85 are added. Upon receiving the power shutoff detection error flag from flash memory 11, CPU 17 sets an error flag value in power shutoff register 82.

Combinational circuit 85 and FF 84 are a circuit generating an RST signal for resetting the system when the error flag value is stored in power shutoff register 82. CPU 17 outputs this RST signal to flash memory 11, peripheral circuit 12, bus controller 15, and flash memory controller 19.

In addition, FF 83 receives from flash memory controller 19 the information indicating that the data rewrite operation is stopped because power shutoff is detected, and holds the received information.

To flash memory controller 19, FF 86 to 87 and a combinational circuit 88 are added. Upon receiving the power shutoff detection error flag from flash memory 11, flash memory controller 19 sets an error flag value in register 86.

In addition, combinational circuit 88 and FF 87 generate information indicating that the data rewrite operation is stopped because power shutoff is detected, when an error flag value is set in register 86, and outputs the information to flash memory 11 and CPU 17.

Figure 13:
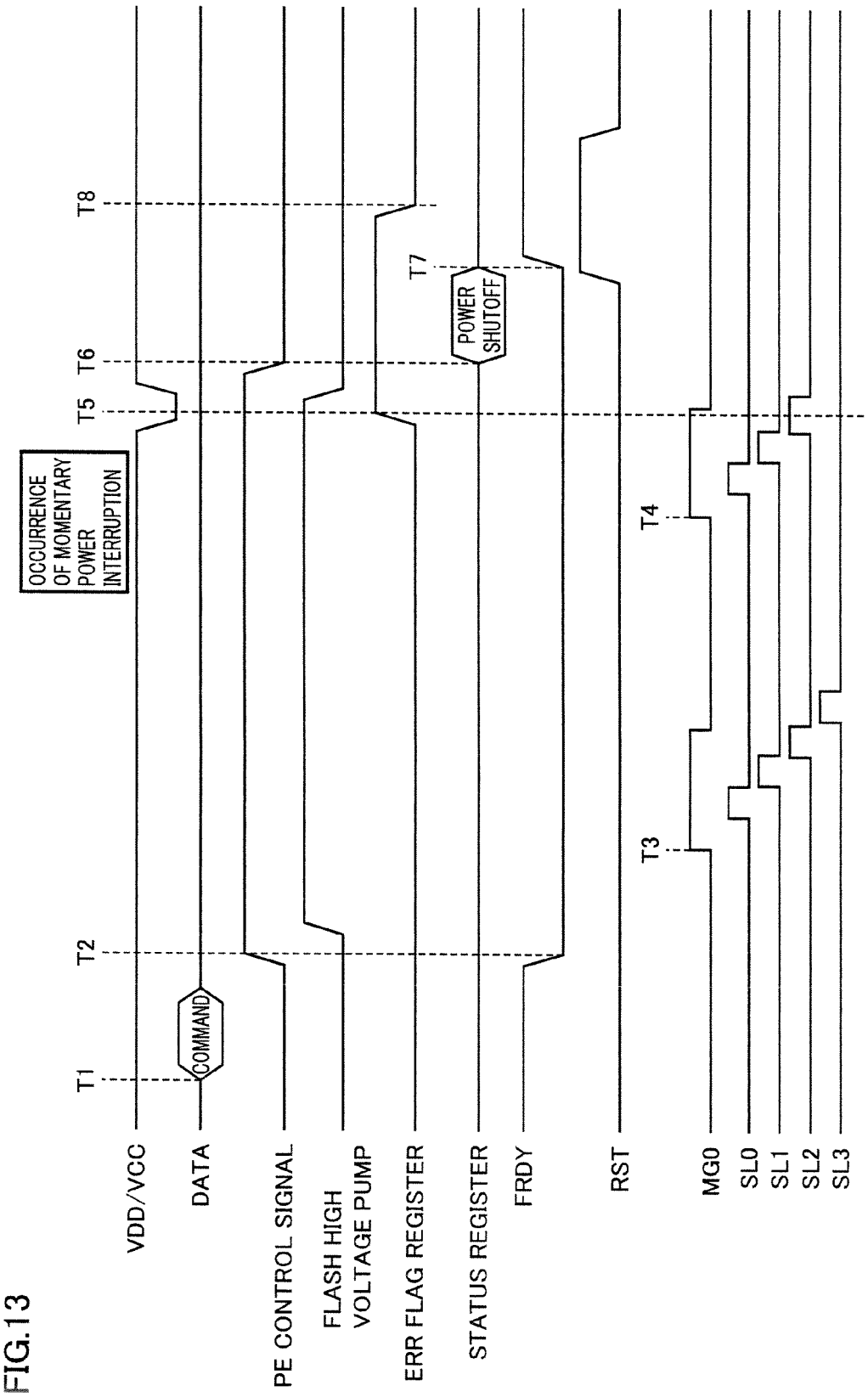
FIG. 13 is a timing chart for illustrating an operation which is performed when microcomputer 1 in the eighth embodiment of the present invention detects power shutoff while data is rewritten.

FIG. 13 is a timing chart for illustrating an operation which is performed when microcomputer 1 in the eighth embodiment of the present invention detects power shutoff while data is rewritten. First, at T1, CPU 17 issues a rewrite command to flash memory 11.

At T2, an FRDY (flash ready) signal is set to L level and the data rewrite operation by flash memory 11 is started. At this time, a PE control signal is activated and generation of a high voltage by charge pump 44 is started.

At T3, MG0 signal is set to H level. Then, SL0 to SL3 are successively set to H level. Thus, data is rewritten. Likewise, at T4, MG0 signal is set to H level and, SL0 to SL3 are successively set to H level. Thus, data is rewritten.

At T5, flash memory 11 sets an error flag value "1" in ERR flag register 81 when power shutoff is detected while data is rewritten. At this time, charge pump 44 starts discharging a high voltage, and inactivation of the PE control signal is performed by flash memory controller 19.

Then, at T6, CPU 17 sets the error flag value in power shutoff register (status register) 82. At T7, CPU 17 generates the RST signal and outputs the RST signal to flash memory 11, peripheral circuit 12, bus controller 15, and flash memory controller 19.

At this time, flash memory 11 performs re-setting of internal register 41 for example. In addition, the FRDY signal is set to H level. At T8, flash memory 11 clears the value of ERR flag register 81 to be ready for detection of new power shutoff.

Figure 14:
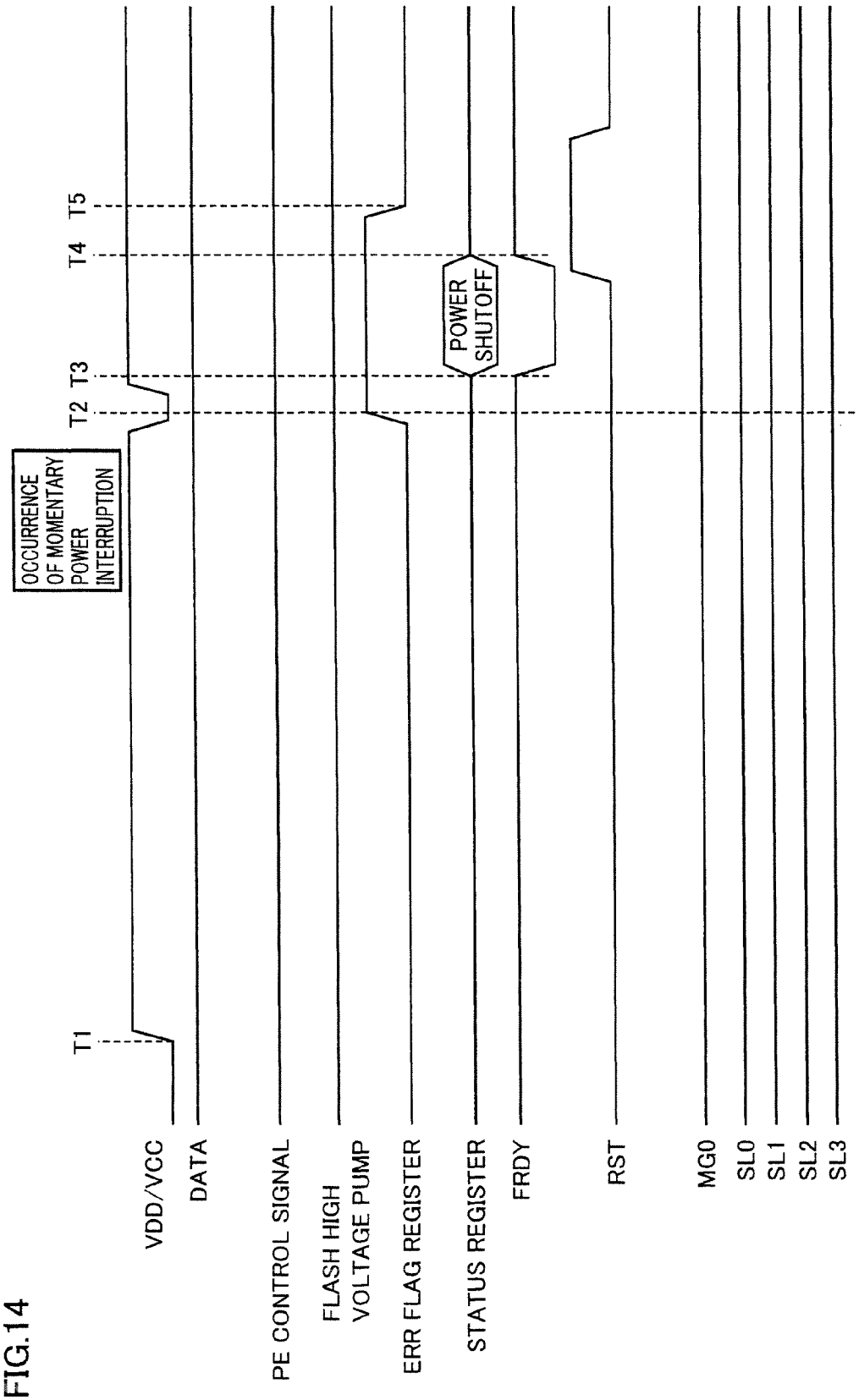
FIG. 14 is a timing chart for illustrating an operation which is performed when microcomputer 1 in the eighth embodiment of the present invention detects power shutoff while an operation other than rewriting of data is performed.

FIG. 14 is a timing chart for illustrating an operation which is performed when microcomputer 1 in the eighth embodiment of the present invention detects power shutoff while an operation other than rewriting of data is performed. First, at T1, microcomputer 1 is powered up.

At T2, when power shutoff is detected, flash memory 11 sets an error flag value "1" in ERR flag register 81. Then, at T3, CPU 17 sets the error flag value in power shutoff register (status register) 82. At this time, the FRDY signal is set to L level.

At T4, CPU 17 generates the RST signal and outputs the RST signal to flash memory 11, peripheral circuit 12, bus controller 15, and flash memory controller 19. At this time, flash memory 11 performs re-setting of internal register 41 for example. In addition, the FRDY signal is set to H level. Then, at T5, flash memory 11 clears the value of ERR flag register 81 to be ready for detection of new power shutoff.

As described above, regarding microcomputer 1 in the present embodiment, CPU 17 is configured to generate the RST signal to automatically reset the system, upon receiving the power shutoff detection error flag from flash memory 11. Accordingly, similar effects to those described above in connection of the first embodiment can be achieved.

It should be construed that embodiments disclosed herein are by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 microcomputer; 11 flash memory; 12 peripheral circuit; 13 oscillation circuit; 14 frequency dividing circuit; 15 bus controller; 16 RAM; 17 CPU; 18 system controller; 19 flash memory controller; 20 input/output port; 21 system bus; 31 I/O; 32 power supply; 33 power supply sw; 34 control logic circuit; 35 storage unit; 36 memory cell; 41 internal register; 42, 43 address latch circuit; 44 charge pump; 45, 46 buffer; 47 power shutoff detection register; 48 EX-OR circuit;

51-56 inverter; 57 NOR circuit; 58-62 P-channel MOS transistor; 63-67 N-channel MOS transistor; 71 ROM; 81-84, 86, 87 FF; 85, 88 combinational circuit; 110 memory cell array; 112 control gate line select drive circuit; 114 memory gate line select drive circuit; 116 source line select drive circuit; 118 column select circuit; 120 data latch circuit

The invention claimed is:

1. A semiconductor device including a nonvolatile memory, comprising:
    an internal register storing a value for controlling an operation of said nonvolatile memory;
    a power shutoff detection register holding a value which changes when power shutoff occurs, configured of a latch circuit holding a value which is more prone to change than the value held in said internal register when power shutoff occurs and including a plurality of P- channel MOS transistors and a plurality of N-channel MOS transistors, configured so that a specific P-channel MOS transistor and a specific N-channel MOS transistor among said plurality of P-channel MOS transistors and said plurality of N-channel MOS transistors have a greater gate width than that of the other P-channel MOS transistor and the other N-channel MOS transistor to have an enhanced drive ability and accordingly a value held in the power shutoff detection register is more prone to change when power shutoff occurs; and
    a controller for controlling the operation of said nonvolatile memory in accordance with the value stored in said internal register, wherein said controller re-sets the value of said internal register when said controller detects power shutoff based on a change of the value held in said power shutoff detection register.

2. The semiconductor device according to claim 1, wherein said controller notifies outside of an occurrence of power shutoff when said controller detects the power shutoff based on a change of the value held in said power shutoff detection register, and re-sets the value of said internal register in accordance with a reset instruction from outside.

3. The semiconductor device according to claim 1, wherein said controller sets, in said power shutoff detection register, data which is stored in a specific memory cell of said nonvolatile memory, and compares the data stored in said specific memory cell with the value stored in said power shutoff detection register to thereby detect power shutoff.

4. The semiconductor device according to claim 1, further comprising a second nonvolatile memory, wherein: said controller sets, in said power shutoff detection register, data which is stored at a specific address of said second nonvolatile memory, and compares the data stored at said specific address with the value stored in said power shutoff detection register to thereby detect power shutoff.

5. The semiconductor device according to claim 1, further comprising an address latch circuit storing an address for selecting a memory cell of said nonvolatile memory, wherein: said power shutoff detection register is configured of a latch circuit holding a value which is more prone to change than a value held in said address latch circuit when power shutoff occurs.

6. A semiconductor device including a nonvolatile memory, comprising:
    an internal register storing a value for controlling an operation of said nonvolatile memory;
    a power shutoff detection register holding a value which changes when power shutoff occurs, configured of a latch circuit holding a value which is more prone to change than the value held in said internal register when power shutoff occurs and including a plurality of P-channel MOS transistors and a plurality of N-channel MOS transistors, configured so that a specific P-channel MOS transistor and a specific N-channel MOS transistor among said plurality of P-channel MOS transistors and said plurality of N-channel MOS transistors have a greater gate width than that of the other P-channel MOS transistor and the other N-channel MOS transistor to have an enhanced drive ability and accordingly a value held in the power shutoff detection register is more prone to change when power shutoff occurs; and
    a controller for controlling the operation of said nonvolatile memory in accordance with the value stored in said internal register, wherein said controller stops a data rewrite operation for said nonvolatile memory, when said controller detects power shutoff based on a change of the value held in said power shutoff detection register while said data rewrite operation is performed.

7. The semiconductor device according to claim 6, wherein said controller stops the data rewrite operation and thereafter re-sets the value of said internal register to re-execute the data rewrite operation.

8. A semiconductor device including a processor and a nonvolatile memory, comprising:
    an internal register storing a value for controlling an operation of said nonvolatile memory;
    a power shutoff detection register holding a value which changes when power shutoff occurs, configured of a latch circuit holding a value which is more prone to change than the value held in said internal register when power shutoff occurs and including a plurality of P-channel MOS transistors and a plurality of N-channel MOS transistors, configured so that a specific P-channel MOS transistor and a specific N-channel MOS transistor among said plurality of P-channel MOS transistors and said plurality of N-channel MOS transistors have a greater gate width than that of the other P-channel MOS transistor and the other N-channel MOS transistor to have an enhanced drive ability and accordingly a value held in the power shutoff detection register is more prone to change when power shutoff occurs; and
    a controller for controlling the operation of said nonvolatile memory in accordance with the value stored in said internal register, wherein said controller stops a data rewrite operation for said nonvolatile memory, when said controller detects power shutoff based on a change of the value held in said power shutoff detection register while said data rewrite operation is performed, and notifying said processor of occurrence of the power shutoff.

9. The semiconductor device according to claim 8, wherein when said processor is notified of occurrence of the power shutoff by said controller, said processor re-issues a rewrite command to said controller to cause said controller to rewrite data.

10. The semiconductor device according to claim 8, wherein: said processor issues a power shutoff detection command to said controller, and when said controller receives the power shutoff detection command from said processor, said controller detects power shutoff based on a change of the value held in said power shutoff detection register.

* * * * *